United States Patent [19]

Haas

[11] Patent Number: 4,741,798
[45] Date of Patent: May 3, 1988

[54] INSTALLATION FOR ETCHING MATERIAL

[75] Inventor: Rainer D. Haas, Herrenberg, Fed. Rep. of Germany

[73] Assignee: Hans Hollmuller Maschinenbau GmbH & Co, Fed. Rep. of Germany

[21] Appl. No.: 929,420

[22] Filed: Nov. 12, 1986

[30] Foreign Application Priority Data

Nov. 11, 1985 [DE] Fed. Rep. of Germany ....... 3539874

[51] Int. Cl.$^4$ .................... H01L 21/306; C23F 1/02
[52] U.S. Cl. .................................. 156/626; 156/345; 156/640; 156/642; 134/2; 134/3; 134/15; 134/18
[58] Field of Search ............... 156/345, 640, 642, 626; 134/2, 3, 10, 15, 18, 27, 28, 113

[56] References Cited

U.S. PATENT DOCUMENTS

| | | | |
|---|---|---|---|
| 3,419,446 | 12/1968 | Benton | 156/626 |
| 3,645,811 | 2/1972 | Davies et al. | 156/626 |
| 3,880,685 | 4/1975 | Behm et al. | 156/345 |
| 3,964,956 | 6/1976 | Snyder | 156/345 |
| 4,042,444 | 8/1977 | Snyder | 156/345 |
| 4,208,240 | 6/1980 | Latos | 156/345 |
| 4,397,708 | 8/1983 | Frantzen | 156/345 |

*Primary Examiner*—Kenneth M. Schor
*Assistant Examiner*—Lori-Ann Cody
*Attorney, Agent, or Firm*—Fred Philpitt

[57] ABSTRACT

In an installation for etching material to be etched consisting at least partly of metal, preferably copper, oxidizing agent is added to the etching medium containing an acid, directly before the actual etching operation, in a quantity which is in a ratio to the quantity required according to stoichiometric calculation for etching the quantity of metal to be removed respectively from the material to be etched. For this a device is provided which emits a first electrical signal. This gives information about the quantity of material to be removed from the material to be etched respectively being processed. A second signal is emitted by a detector when the material to be etched enters the actual etching machine. Both signals are processed by a central control unit. This takes place in such a way that the central control unit emits a third signal which it has ascertained according to a memorized program from the first signal and whenever the detector signal is received. The third signal corresponds to the respectively desired quantity of oxidizing agent and acts on a metering device which then undertakes measuring of the quantity of oxidizing agent. In the same way acid may be added to the etching medium for regeneration in a stoichiometrically defined quantity.

13 Claims, 1 Drawing Sheet

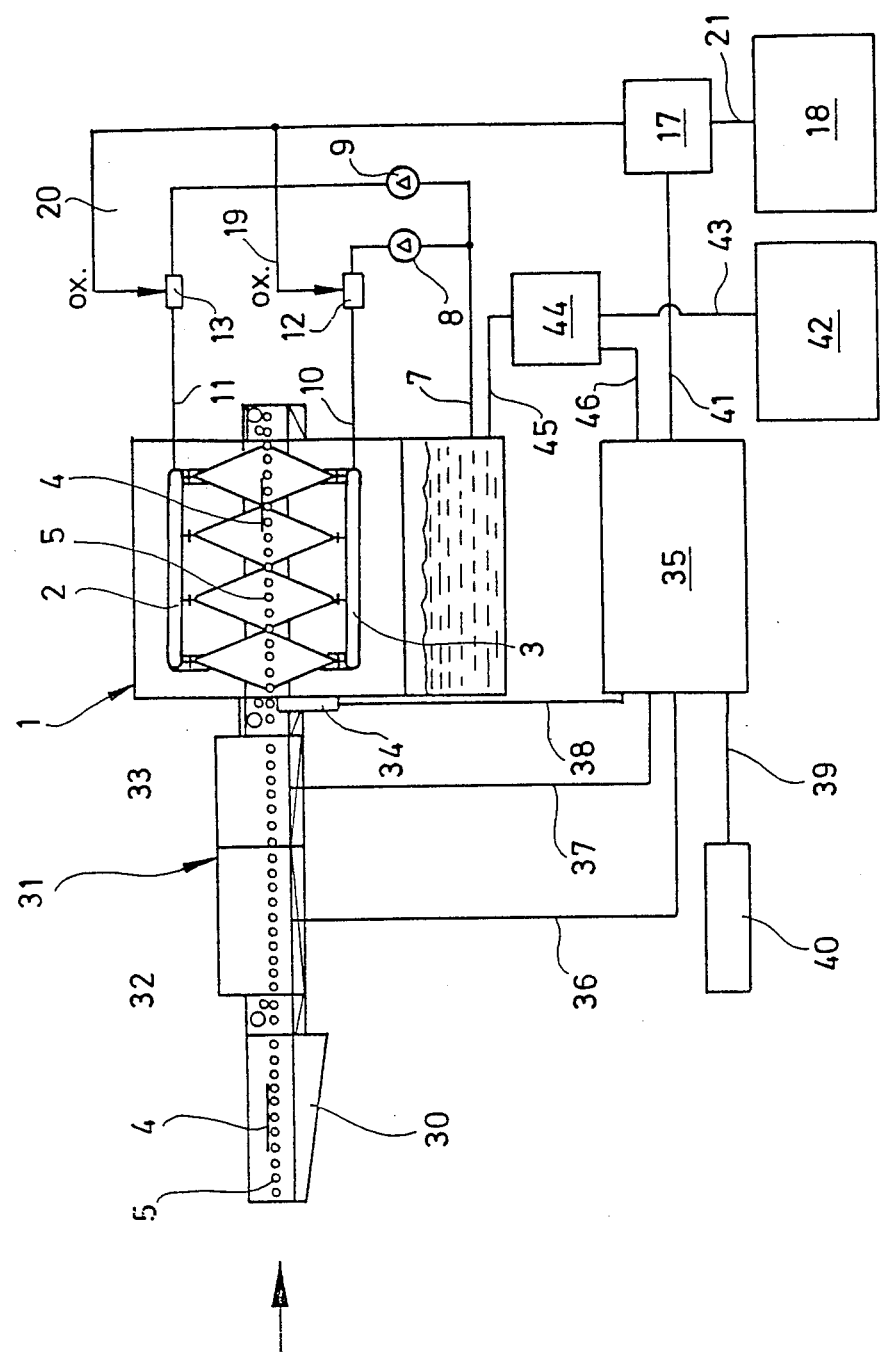

INSTALLATION FOR ETCHING MATERIAL

DESCRIPTION

The invention relates to an installation for etching material to be etched, preferably printed circuit boards, consisting at least partly of metal, preferably copper, with an etching medium containing an acid, preferably sulphuric acid, with an etching machine comprising a plurality of nozzles and an etching medium sump, with a pump which removes etching medium from the etching medium sump and supplies it to the nozzles by way of a device in which an oxidizing agent and/or acid is added to the etching medium in stoichiometric dependence on the quantity of metal to be etched from the respective material to be etched.

An installation of this type is described in EA-A No. 00 53 719. However, there are no details as to how the aforedescribed regulation or control of the addition of oxidizing agent should actually take place in practice. If the aim set, namely of keeping the concentration of the oxidizing agent in the etching medium which has drained from the material to be etched as low as possible, is actually to be achieved, it is necessary to match the addition of oxidizing agent substantially exactly to the quantity of material to be removed which varies from one type of material to be etched to another.

It is the object of the present invention to develop an installation of the afore-mentioned type so that the necessary matching of the addition of oxidizing agent or the addition of acid to the material to be etched respectively being processed can be carried out without problems and exactly even by operators with little training.

This object is achieved according to the invention due to the fact that the installation comprises:

(a) A device which emits at least one first signal, which given information about the quantity of metal to be removed from the material to be etched respectively being processed;

(b) A detector which emits a second signal when the material to be etched respectively being processed enters the etching machine;

(c) A central control unit, to which the first and second signal are supplied and which determines the corresponding quantity of oxidizing agent and/or acid from the first signal and emits a corresponding third signal when the second signal arrives;

(d) A metering device, to which the third signal is supplied and which removes a quantity of oxidizing agent and/or acid from a storage tank, which quantity corresponds to this third signal and adds it to the etching medium conveyed by the pump to the nozzles.

Thus as a rule in an installation according to the invention, all the adjustments serving for matching the quantity of oxidizing agent or quantity of acid to the quantity of metal to be removed are carried out as far as possible automatically, so that no mistakes on the part of the operator may occur.

The central control unit may calculate the third signal from the first signal according to a prescribed algorithm. In many cases, a proportional dependence is appropriate and adequate, in which case the proportionality factor is ascertained experimentally for the respective etching machine and the respective metal to be etched.

Alternatively, the central control unit may assign the third signal to the first signal according to tables which are stored in a memory of the central control unit. The values in the table are again determined experimentally for the respective etching installation and the metal to be processed.

It is easiest if the device which emits at least one first signal comprises an optical reflection measuring device, which determines the exposed metal surface on the material to be etched and a thickness measuring device, which determines the thickness of the metal layer to be removed from the material to be etched, in which case the central control unit calculates the quantity of metal to be etched from the exposed surface and the thickness of the metal layer to be etched. In this development, the most varied types of material to be etched may be processed on the installation one after the other at random, in which case it is not necessary for the operator to pay special attention. Also, the material to be etched need not be of particularly standardised, recurring types.

However, if primarily standardised, recurring types of material to be etched are to be processed on the installation, it is recommended that the device, which emits at least one first signal, is a reading head, which deciphers a code provided on the material to be etched respectively being processed, in which case the first signal is representative of the deciphered code.

Finally it is simplest if the device which emits at least one first signal is a keyboard, by which a code for the material to be etched respectively being processed or the quantity of metal to be etched can be fed directly by hand into the central control unit. This development is used wherever large runs of the same material to be etched are to be processed and a changeover to another type of material to be etched is only rare. In this case, the identification for the type of material to be etched or the quantity of metal to be removed with this type of material to be etched can be fed in by hand.

Embodiments of the invention are described in detail hereafter with reference to the drawing. The single FIGURE shows an etching installation diagrammatically.

The etching installation illustrated in the drawing comprises an inlet unit 30, in which the material 4 to be etched—for example printed circuit boards—is laid on a roller bed 5. The roller bed 5 conveys the material to be etched through the entire etching installation from left to right in the drawing.

The material 4 to be etched first of all passes from the inlet unit 30 into a device 31 in which the quantity of metal which must be removed in the case of the material 4 to be etched respectively being processed, is determined. This device 31 first of all contains a known, commercially available optical reflection measuring device 32, which determined the exposed metal surface of the material 4 to be etched from the reflection of light on the material 4 to be etched. Next, the material 4 to be etched passes within the device 31 through a thickness measuring device 33, which is likewise commercially available and determines the thickness of the metal layer to be removed from the material 4 to be etched.

The material 4 to be etched then enters the actual etching machine 1, the timing of which is monitored by a detector 34. This detector 34 may be a (reflection) light barrier, a micro-switch or the like.

The etching machine 1 comprises an upper bank of nozzles 2 comprising a plurality of nozzles and a lower bank of nozzles 3 likewise comprising a plurality of nozzles. The material 4 to be etched moved along the roller bed 5 is sprayed from above and below from the banks of nozzles 2 and 3 with liquid etching medium containing sulphuric acid.

An etching medium sump 6 is located in the lower region of the etching machine 1. A removal pipe 7 leads from the etching medium sump 6 to the suction side of two pumps 8 and 9, whereof the outlets are connected to the banks of nozzles 3 and 2 by way of pipes 10 and 11 and by way of oxidizing agent injectors 12 and 13 located in the pipes 10 and 11.

A central control unit 35 is connected by way of eletrical leads 36, 37, 38 to the optical reflection measuring device 32, the thickness measuring device 33 and the detector 34 and receives from them electrical signals which correspond to the respective measured values. The central control unit 35 is also connected by way of a lead 39 to a keyboard 40 serving as an input unit.

The output signal produced by the central control unit 35 is sent by way of a lead 41 to a metering device 17. According to the output signal supplied by the central control unit 35, the metering device 17 removes oxidizing agent by way of a pipe 21 from a storage tank 18 and supplies the latter by way of the pipes 19 and 20 to the injectors 12, 13.

The afore-described etching installation operates as follows:

It is the aim to bring the quantity of oxidizing agent to be added to the etching medium by way of the injectors 12, 13 for each individual etching operation into predetermined stoichiometric ratio with respect to the quantity of metal to be etched from the material 4 to be etched. This can take place in such a way that the quantity of oxidizing agent corresponds to the quantity of metal to be etched in exact stiochiometry; alternatively it is also possible to operate the installation with a small "safety excess" of oxidizing agent, which exceeds the quantity stoichiometrically required. In both cases the purpose of the measure is to keep the concentration of oxidizing agent in the etching medium as low as possible, since the latter could hinder the operation of the circulating pumps or an electrolytic cell in the regeneration of the etching medium.

For the afore-described purpose, by way of the leads 36 and 37, the central control unit 35 receives data (namely surface area and thickness of the metal layer to be removed) from the device 31, from which the quantity of metal to be etched from the material 4 can be determined, which passes respectively through the device 31 and is intended to be etched in the etching machine 1. According to a program which has been memorized, the central control unit 35 assigns the corresponding quantity of oxidizing agent to the ascertained quantity of metal to be removed. In this case, either in accordance with the stoichiometric ratio, an algorithm can be used (for example a linear dependence) or the corresponding quantities of metal to be removed and oxidizing agent are taken from (empirical) tables, which are stored in a memory in the central control unit 35. If the detector 34 supplies the central control unit 35 with the signal which indicates the arrival of the respective material 4 to be etched into the etching machine 1, then the central control unit sends a signal to the metering device 17 which is representative of the quantity of oxidizing agent required. The metering device 17 carries out this command in that it removes the corresponding quantity of oxidizing agent from the storage container 18 and adds it by way of the injectors 12, 13 to the etching medium circulated by the pumps 8, 9.

In this embodiment, the keyboard 40 serves exclusively for programming the central control unit 35 and for feeding in the data to be stored in its memory.

A second embodiment not illustrated in the drawing is used especially when a limited number of standard types of material to be etched are to be processed in the installation. In these cases, the complicated device 31 composed of the reflection device 32 and the thickness measuring device 33 is replaced by a less expensive reading head, which is capable of recognizing a code applied respectively to the material 4 to be etched, as it travels through the installation. The reading head then sends a signal corresponding to the code to the central control unit 35, which from the tables stored in its memory assigns the quantity of oxidizing agent corresponding to this code, which symbolises a certain quantity of metal to be removed. The remaining functions of the second embodiment correspond to those of the embodiment described first of all.

A third embodiment likewise not illustrated in the drawing is used wherever larger runs of material to be etched are to be processed and a change-over from one type of material to be etched to another must therefore take place only relatively seldom. In this case it is possible to dispense with the use of an automatic apparatus for identifying the type of material to be etched or the quantity of metal to be removed. Instead of this, when changing-over from one type of material to be etched to another, a corresponding code is fed by hand by way of the keyboard 40 into the central control unit 35. Again by way of memorized tables, the latter assigns the corresponding amount of oxidizing agent to the code keyed-in and sends a corresponding signal to the metering device 17. In this less expensive case, the keyboard 40 is thus to be regarded as the device which given information about the quantity of metal to be removed from the material 4 to be etched respectively being processed.

The function of the reference numberals 42 to 46 which have not yet been described is as follows:

Generally, when etching metal, not only oxidizing agent but also acid is used up in the etching medium. In so far that no electrolytic regeneration of the etching medium is provided, acid must thus be added in the course of the etching operation. This may take place stoichiometrically in exactly the same way as was described above for the stoichiometric addition of oxidizing agent.

According to an internal programme or according to memorized tables from the input signal or signals, which indicate the quantity of metal to be etched, the central control unit produces a second output signal on the lead 46, which corresponds to the quantity of acid to be added in an appropriate manner. The second output signal is sent to a second metering device 44, which removes the amount of acid in question from a storage tank 42 by way of the pipe 43 and supplies it by way of the pipe 46 to the sump of the etching machine 1.

The term "etching" was used hitherto in a way which includes not only the complete through-etching of a metal layer, but also the initial etching of a metal up to a certain depth.

I claim:

1. Apparatus for etching supports that have deposited thereon an etchable metal with an etching medium, which apparatus includes
    (a) an etching chamber,
    (b) means to convey said supports with metal deposited thereon through said etching chamber, (c) a plurality of nozzles which are positioned to spray etching medium containing acid on said supports as they move through said etching chamber, (d) a sump for receiving etching medium withdrawn from said etching chamber, (e) circulating means for circulating etching medium from said sump back to said plurality of nozzles, (f) a reservoir for providing an oxidizing agent and a reservoir for providing an acid, (g) a device for emitting a first signal indicative of the quantity of metal on said support, (h) a detector which emits a second signal when said support enters said etching chamber, (i) a control unit which receives said first and second signals and which generates a third signal indicative of the quantity of material in said reservoirs which needs to be included into said etching medium in order to achieve the amount stoichiometrically necessary, for said etching medium to remove the desired quantity of deposited metal from said support, and (j) metered conduits establishing fluid flow connection of said reservoirs of (f) with either the sump of (d) or the circulation means of (e), said metered conduits being responsive to said third signal set forth in (i).

2. Apparatus according to claim 1 wherein said control unit is a means for calculating the third signal from the first signal according to a prescribed algorithm.

3. Apparatus according to claim 1 wherein said control unit is a means for assigning the third signal to the first signal according to tables which are stored in a memory of the control unit.

4. Apparatus according to claim 1 wherein said device of (g) comprises an optical reflection measuring device which determines the exposed metal surface on the material to be etched and a thickness measuring device which determines the thickness of the layer of metal to be removed from said support and said control unit calculates the quantity of metal to be etched from the exposed surface and the thickness of the metal layer to be removed.

5. Apparatus according to claim 1 wherein said device (g) is a reading head, which deciphers a code provided on said support in which case the first signal is representative of the deciphered code.

6. Apparatus according to claim 1 wherien said device (g) is a keyboard, by which a code for the respective material to be processed or the quantity of metal to be etched can be fed directly by hand into said control unit.

7. A method for etching supports that have deposited thereon an etchable metal with an etching medium, which method includes (a) providing an etching zone, (b) conveying said supports with metal deposited thereon through said etching zone, (c) spraying an etching medium containing acid with a means for spraying on said supports as they move through said etching zone to thereby etch said deposited metal, (d) withdrawing etching medium from said etching zone with withdrawing means, (e) circulating withdrawn etching medium with circulating means back to the spraying means of stop (c)

(f) providing a supply of an oxidizing agent and a supply of acid, (g) emitting a first signal indicative of the quantity of metal on said support, (h) emitting a second signal when said support enters said etching zone, (i) receiving said first and second signals and generating a third signal indicative of the quantity of oxidizing agent and acid which needs to be included into said etching medium in order to achieve the amount stoichiometrically necessary to remove the desired quantity of deposited metal from said support, and (j) metering the supplies of oxidizing agent and acid set forth in step (f) to the withdrawing means of step (d) and the circulating means of step (e), said metering being responsive to said third signal set forth in step (i).

8. A method according to claim 7 wherein said third signal is calculated from the first signal according to a prescribed algorithm.

9. A method according to claim 7 wherein said third signal is assigned to the first signal according to tables which are stored in a memory of a control unit.

10. A method according to claim 7 wherein said first signal is emitted by an optical reflection measuring device which determines the exposed metal surface on the material to be etched and a thickness measuring device which determines the thickness of the layer of metal to be removed from said support, and the quantity of metal to be etched from the exposed surface and the thickness of the metal layer to be removed is calculated.

11. A method according to claim 7 wherein said metal is cooper.

12. A method according to claim 7 wherein said acid is sulphuric acid.

13. A method according to claim 12 wherein said metal is copper.

* * * * *